United States Patent
Kanazaki et al.

(10) Patent No.: US 7,103,271 B2
(45) Date of Patent: Sep. 5, 2006

(54) LIGHT IRRADIATION HEAT TREATMENT METHOD AND LIGHT IRRADIATION HEAT TREATMENT APPARATUS

(75) Inventors: Emi Kanazaki, Takaoka (JP); Satoshi Shibata, Takaoka (JP); Fumitoshi Kawase, Higashitonami-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/000,223

(22) Filed: Dec. 1, 2004

(65) Prior Publication Data

US 2005/0173386 A1    Aug. 11, 2005

(30) Foreign Application Priority Data

Jan. 20, 2004   (JP) .............................. 2004-011841

(51) Int. Cl.
*A21B 2/00*    (2006.01)
*F27B 5/14*    (2006.01)

(52) U.S. Cl. ...................... 392/416; 392/418; 219/370; 219/405; 219/411; 118/724; 118/725; 118/501

(58) Field of Classification Search .............. 219/390, 219/405, 411; 392/416, 418; 118/724, 725, 118/50.1
See application file for complete search history.

(56) References Cited

U.S. PATENT DOCUMENTS

| 5,053,247 | A | 10/1991 | Moore |
| 5,715,361 | A | 2/1998 | Moslehi |
| 6,001,175 | A | 12/1999 | Maruyama et al. |
| 6,284,048 | B1 | 9/2001 | Van Bilsen et al. |
| 6,309,458 | B1 | 10/2001 | Habuka et al. |
| 6,393,210 | B1 | 5/2002 | Wu |
| 6,771,895 | B1 * | 8/2004 | Gat et al. .................... 392/416 |

FOREIGN PATENT DOCUMENTS

JP   11214323   8/1999

* cited by examiner

*Primary Examiner*—Shawntina Fuqua
(74) *Attorney, Agent, or Firm*—Stevens, Davis, Miller & Mosher, LLP (57) ABSTRACT

A light irradiation heat treatment apparatus and method may use a plane-shaped light irradiation heating component, facing one surface of a workpiece supported in a furnace, to raise the temperature of the workpiece. The temperature of the workpiece is raised by setting an intensity distribution for light irradiated from the light irradiation heating component in accordance with the resistivity of the workpiece. Thereafter, the workpiece is irradiated with light having the set light intensity distribution to raise its temperature.

13 Claims, 9 Drawing Sheets

LIGHT IRRADIATION HEAT TREATMENT METHOD AND LIGHT IRRADIATION HEAT TREATMENT APPARATUS

BACKGROUND OF THE INVENTION

1. Field of the Invention

The present invention relates to a light irradiation heat treatment method and a light irradiation heat treatment apparatus in a manufacturing process of a semiconductor device.

2. Description of the Prior Art

In a semiconductor manufacturing process, a light irradiation heat treatment apparatus using a lamp is used for a short time-period heat treatment of, for example threshold voltage control of MOS transistor, impurity ion activation after ion implantation into sources, drains or the like, forming a silicide from a high melting point metal film, achieving low resistance of the metal silicide or the like. A typical configuration of this type of heat treatment apparatus is such that a plate-type workpiece is heated from either both sides or one side thereof using multiple lamps. The lamp is faced to a surface of the workpiece and the multiple lamps are arranged at a uniform density at a distance close to the surface. While the workpiece such as a semiconductor substrate is heat-treated at a substantially constant temperature, a feedback control is then performed to light irradiation intensity of the lamp so that the workpiece may be maintained at a predetermined temperature. In this case, the heat treatment apparatus measures a wavelength of an electromagnetic wave radiated from the heated workpiece, with a plurality of pyrometers disposed in the vicinity of either both sides or one side of the workpiece, and further converts it into a temperature. As described above, a process which feeds back the measured temperature by the pyrometer and controls the light irradiation intensity is called a closed circuit control process. This closed circuit control process works effectively at not less than a constant temperature at which sufficient radiation intensity is obtained from the workpiece. This temperature may typically be at 300° C. to 600° C. or more.

On the other hand, in an early phase of starting the heat treatment for the workpiece in the light irradiation heat treatment apparatus, there is a step of heating at a constant light irradiation intensity the workpiece at 300° C. to 600° C. or more which is a controllable temperature by the closed circuit control process, and this process is called an open loop control process. As described above, a light irradiation heat treatment comprises this open loop control process and the closed circuit control process.

Further, since the temperature rises as high as the temperature described above in a short time-period in a light irradiation heat treatment process, stress is applied to the workpiece, whereas consideration for relieving this is also made, and the art relative to that is described in, for example Japanese Patent Laid-Open Hei No. 11-214323 official report.

However, in the prior art described above, at the open loop control process immediately after starting the light irradiation in the light irradiation heat treatment apparatus, because of rapidly heating the workpiece at a constant light irradiation intensity, temperature rising speed usually changes in accordance with positions within the workpiece surface such as the semiconductor substrate or the like, resulting in a temperature distribution. The workpiece is therefore subjected to stress, so that there is caused distortion, deformation, warpage, crack or the like. Further, as a result of a crystal defect introduced to the workpiece in some cases, there has been a problem of causing a characteristic variation between semiconductor elements built in the semiconductor substrate to be the workpiece, and a defect in reliability or the like in addition to that.

SUMMARY OF THE INVENTION

The object of the present invention is to provide a light irradiation heat treatment method and a light irradiation heat treatment apparatus capable of relieving stress applied to the workpiece by giving a distribution to a light irradiation intensity of an open loop control process in accordance with a resistivity related to a thermal conductivity of a constituent material of a workpiece, and by reducing temperature variation of the workpiece during a temperature rise; and manufacturing a highly reliable semiconductor device without distortion, deformation, warpage, crack or the like and without characteristic fluctuation.

In order to achieve the object described above, according to a light irradiation heat treatment method of a first invention, a light irradiation heat treatment method for supporting a workpiece in a furnace, and heat-treating the workpiece by means of plane-shaped light irradiation heating means provided so as to face to one surface of the workpiece, includes a process for irradiating a light having a flat intensity distribution to the workpiece from the light irradiation heating means and raising the temperature of the workpiece.

According to this configuration, at an open loop control process after starting the light irradiation, the light irradiation intensity is set for every plurality of areas, thereby making it possible to reduce temperature variation of the workpiece. It is therefore possible to reduce stress, suppress a characteristic fluctuation of the semiconductor device built in the workpiece without distortion, deformation, warpage, crack or the like, and reduce a defect in reliability.

According to a light irradiation heat treatment method of a second invention, a light irradiation heat treatment method for supporting a workpiece in a furnace, and heat-treating the workpiece by means of plane-shaped light irradiation heating means provided so as to face to one surface of the workpiece, wherein a resistivity of the workpiece is less than 1 ohm-cm, includes a process for irradiating a light having a flatly uniform intensity to the workpiece from the light irradiation heating means and raising the temperature of the workpiece.

According to this configuration, at an open loop control process after starting the light irradiation, it possible to reduce temperature variation of the workpiece by setting the light irradiation intensity uniformly. The reason is that since a response of a substrate to a temperature change and a temperature distribution is fast when the workpiece has a low resistance, the distribution will be directly reflected to a temperature distribution in the workpiece when a distribution is given to the light irradiation intensity, so that it is preferable to make the light irradiation intensity uniform.

A light irradiation heat treatment method of a third invention, in the light irradiation heat treatment method of the first invention, includes a process for irradiating a light having a flatly uniform intensity to the workpiece from the light irradiation heating means and heat-treating it after the process for raising the temperature of the workpiece.

According to this configuration, there can be performed a closed circuit control process which feeds back a measured temperature and controls the light irradiation intensity so as to maintain a predetermined temperature at which sufficient radiation intensity is obtained from the workpiece.

According to a light irradiation heat treatment method of a fourth invention, in the light irradiation heat treatment method of the first invention, a resistivity of the workpiece is not less than 1 ohm-cm, and a light intensity in a peripheral portion of a light intensity distribution from the light irradiation heating means is smaller than that of a central portion.

According to this configuration, it is effective in reduction of stress of the workpiece caused by a rapid temperature rise of the substrate due to an increase in temperature variation after starting the light irradiation.

According to a light irradiation heat treatment method of a fifth invention, a light irradiation heat treatment method for supporting a workpiece in a furnace, and heat-treating the workpiece by means of plane-shaped light irradiation heating means provided so as to face to one surface of the workpiece, includes a process for irradiating a light having a flat light intensity distribution according to a resistivity of the workpiece to the workpiece from the light irradiation heating means and raising a temperature of the workpiece.

According to this configuration, at an open loop control process after starting the light irradiation, while function and effect similar to that of the first invention is obtained, it is possible to further split the workpiece into a number of areas according to the resistivity of the workpiece to control the light irradiation intensity for every area.

According to a light irradiation heat treatment method of a sixth invention, in the light irradiation heat treatment method according to any one of the first, third, fourth, or fifth invention, the resistivity of the workpiece is not less than 1 ohm-cm, the workpiece has a circle shape, and the flat light intensity distribution from the light irradiation heating means is a concentric circle-shaped distribution.

According to this configuration, it is possible to form a light intensity distribution corresponding to a distance from a center of the workpiece.

A light irradiation heat treatment apparatus of a seventh invention comprises a support element for supporting a workpiece provided in a furnace, plane-shaped light irradiation heating means provided so as to face to one surface of the workpiece supported by the support element, temperature measuring means provided so as to face to the other surface at the other side with respect to the one surface of the workpiece, light irradiation intensity control means for controlling a light irradiation intensity distribution in a plane of the light irradiation heating means so that a temperature measured by the temperature measuring means may become a predetermined temperature based on a resistivity of the workpiece.

According to this configuration, the light irradiation intensity is set for every plurality of areas by the light irradiation intensity control means, so that making it possible to reduce temperature variation of the workpiece. It is therefore possible to reduce stress, suppress a characteristic fluctuation of the semiconductor device built in the workpiece without distortion, deformation, warpage, crack or the like, and reduce a defect in reliability.

A light irradiation heat treatment apparatus of an eighth invention comprises a support element for supporting a workpiece provided in a furnace, plane-shaped light irradiation heating means provided so as to face one surface of the workpiece supported by the support element, temperature measuring means provided so as to face the other surface at the other side with respect to the one surface of the workpiece, resistivity measurement means for measuring a resistivity of the workpiece, light irradiation intensity control means for controlling a light irradiation intensity distribution in a plane of the light irradiation heating means so that a temperature measured by the temperature measuring means may become a predetermined temperature based on a resistivity of the workpiece measured by the resistivity measurement means.

According to this configuration, while function and effect similar to that of the seventh invention is obtained, it is possible to split the light irradiation intensity to the workpiece into a plurality of areas and automatically set them according to the resistivity of the workpiece measured by the resistivity measurement means.

According to a light irradiation heat treatment apparatus of a ninth invention, in the light irradiation heat treatment apparatus of any one of the seventh or eighth invention, the light irradiation heating means consists of a group in which multiple heat lamps are flatly arranged, the group of the heat lamps is split into a plurality of flat areas, and a light irradiation intensity independent from each other can be set to each area.

According to this configuration, it is possible to automatically set the light intensity to be irradiated for every group area of the lamps so as to give a distribution to the light irradiation intensity of the group of multiple lamps.

According to a light irradiation heat treatment apparatus of a tenth invention, in the light irradiation heat treatment apparatus of any one of the seventh or eighth invention, the light irradiation intensity control means controls so as to irradiate a light having a flat light irradiation intensity distribution from the light irradiation heating means when the resistivity of the workpiece is not less than 1 ohm-cm, and controls so as to irradiate a light having a flatly uniform light irradiation intensity from the light irradiation heating means when the resistivity of the workpiece is less than 1 ohm-cm.

According to this configuration, it is possible to reduce temperature variation of the workpiece after starting the light irradiation according to the resistivity of the workpiece. In other words, the reason is that when the resistivity of the workpiece is not less than 1 ohm-cm, giving the distribution to the light irradiation intensity can reduce a temperature gradient within the workpiece, and when it is not more than 1 ohm-cm, if giving the distribution to the light irradiation intensity, then the distribution is directly reflected to the temperature within the workpiece, so that it is preferable to make the light irradiation intensity uniform.

According to a light irradiation heat treatment apparatus of an eleventh invention, in the light irradiation heat treatment apparatus of the ninth invention, the workpiece is a semiconductor substrate, and the group of the heat lamps is split into a plurality of areas in a shape of a flatly concentric circle.

According to this configuration, it is possible to form the light intensity distribution corresponding to a distance from the center of the workpiece.

DETAILED DESCRIPTION OF THE PREFERRED EMBODIMENT

Figure 1:
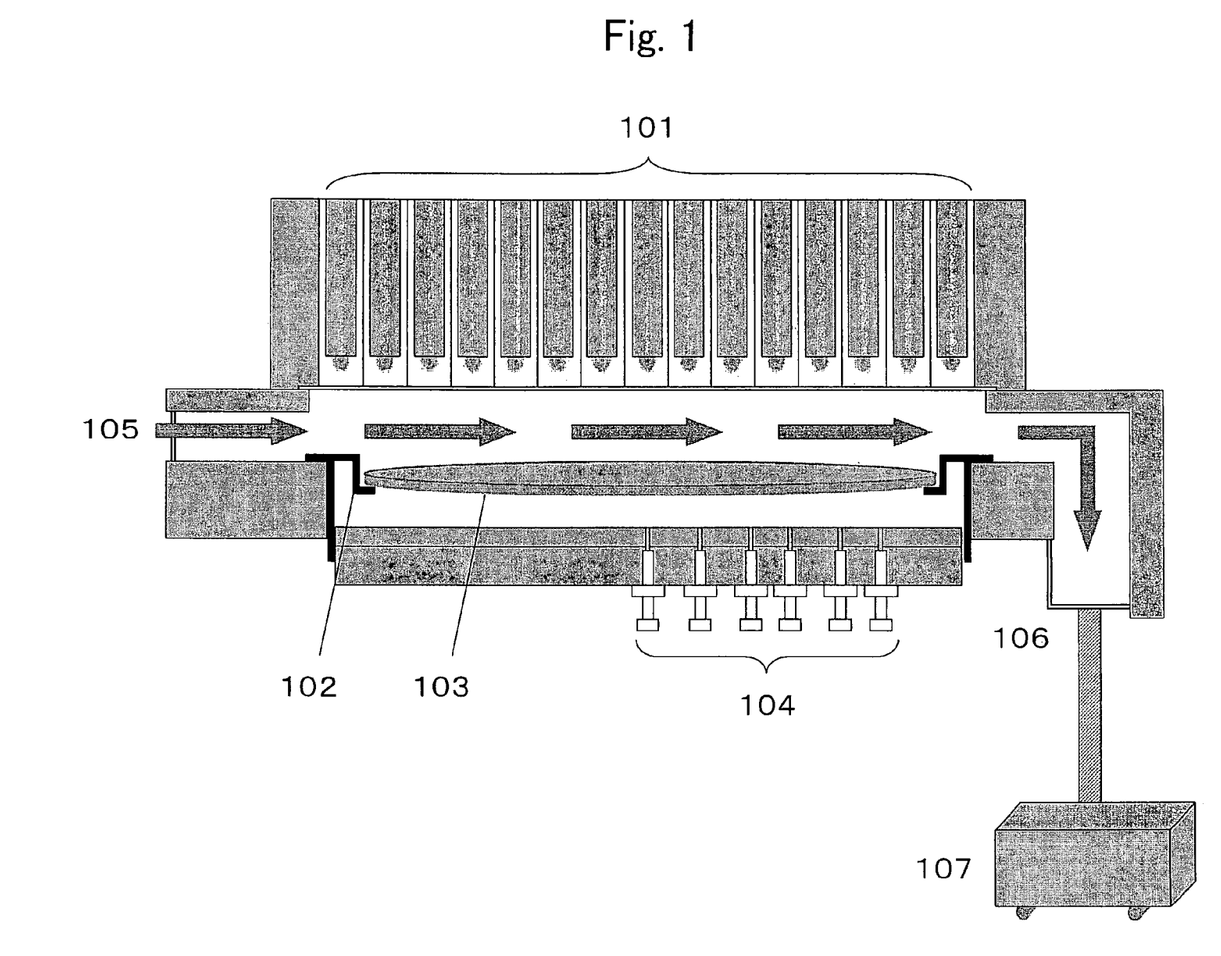
FIG. 1 is a schematic diagram of a light irradiation heat treatment apparatus in an embodiment of the present invention.

Description will be made of an embodiment of the present invention based on FIG. 1 through FIG. 7. FIG. 1 is a schematic cross-sectional view of a lamp type light irradiation heat treatment apparatus in the embodiment of the present invention.

As shown in FIG. 1, this light irradiation heat treatment apparatus comprises a support element 102 for supporting a workpiece 103 provided in a furnace, plane-shaped light irradiation heating means 101 provided so as to face to one surface of the workpiece 103 supported by the support element 102, temperature measuring means 104 provided so as to face to the other surface at the other side with respect to the one surface of the workpiece 103, light irradiation intensity control means for controlling a light irradiation intensity distribution in a plane of the light irradiation heating means 101 so that a temperature measured by the temperature measuring means 104 may become a predetermined temperature based on a resistivity of the workpiece 103.

In this case, multiple cylindrical lamps (light irradiation heating means) 101 for heating the workpiece, especially a plate-shaped substrate, to raise the temperature thereof are flatly arranged in the apparatus, and the workpiece 103 is supported by the workpiece support element 102 and faces to the multiple lamps 101. This support element 102 only supports the workpiece 103 at a very small peripheral portion, and a backside surface of the workpiece 103 is in a state of being exposed.

A plurality of pyrometers (temperature measuring means) 104 for measuring a temperature are disposed so as to face to the lamp 101 at the opposite side with respect to the workpiece 103. The pyrometer 104 measures a wavelength that the workpiece 103 radiates, and determines a temperature of the workpiece 103 based on a value of the measured wavelength. In addition, it is constituted so that inert gas may flow along a surface of the workpiece 103 from an inert gas inlet 105, and be discarded from an inert gas exhaust port 106, and an exhaust gas pump 107 is connected to the end. Moreover, the workpiece 103 is provided with a mechanism for rotating with the support element 102 during a light irradiation heat treatment.

Figure 2:
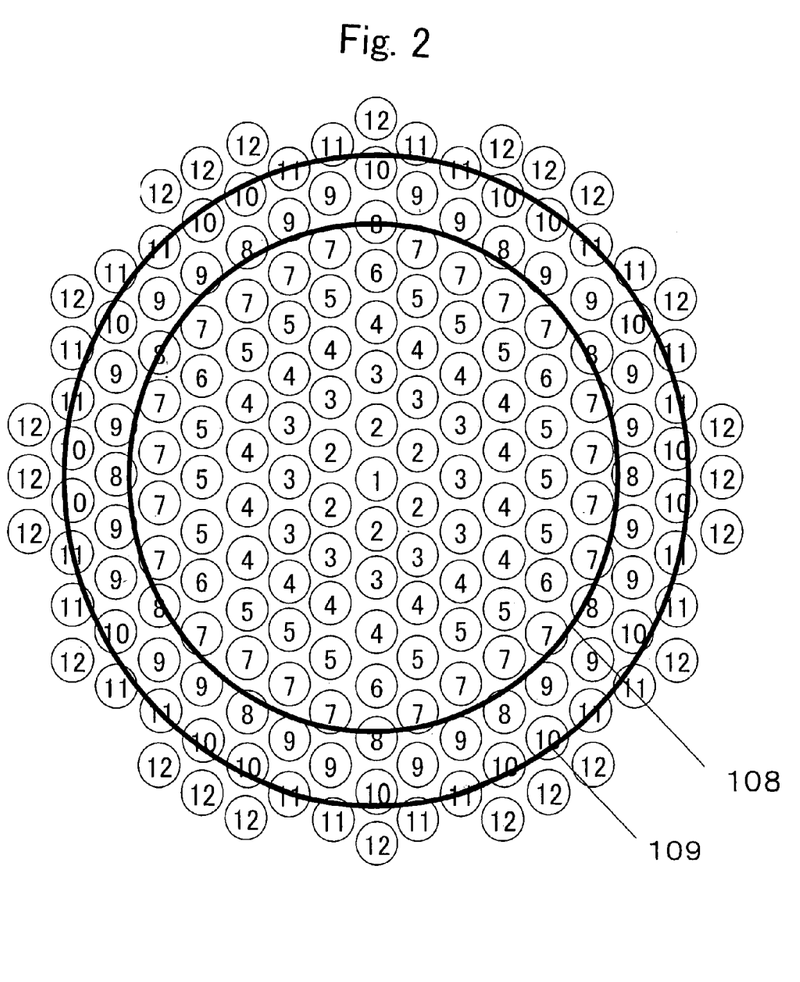
FIG. 2 is a plan view of a lamp arrangement of the light irradiation heat treatment apparatus in an embodiment of the present invention.

FIG. 2 shows a plane arrangement view of the lamp in the light irradiation heat treatment apparatus in FIG. 1. In FIG. 2, a plurality of small circles indicate an arrangement of the lamp, and numbers 1 through 12 described in the circles indicate that there exist twelve areas in total which can independently control an electric power (power) supplied to the lamp 101. In other words, the lamp 101 in the heat treatment apparatus of the embodiment of the present invention is constituted so that the electric power may be independently controlled in the twelve areas. In addition, a circle 108 indicates a position of the workpiece 103 in a case where a semiconductor substrate having an eight-inch diameter is used as the workpiece 103 disposed so as to face to the lamp 101, and a circle of 109 indicates an outer edge position of the workpiece support element 102.

Description will be made of a light irradiation heat treatment method of the embodiment of the present invention using the light irradiation heat treatment apparatus which has the above configuration. That is, it includes an open loop control process for raising the temperature of the workpiece 103 at a constant light irradiation intensity up to a controllable temperature of the pyrometer 104, and a closed circuit control process which measures a wavelength that the workpiece 103 radiates by the pyrometer 104, determines the temperature of the workpiece 103 based on the value of the wavelength, and adjusts the light irradiation intensity of the lamp 101.

Figure 3:
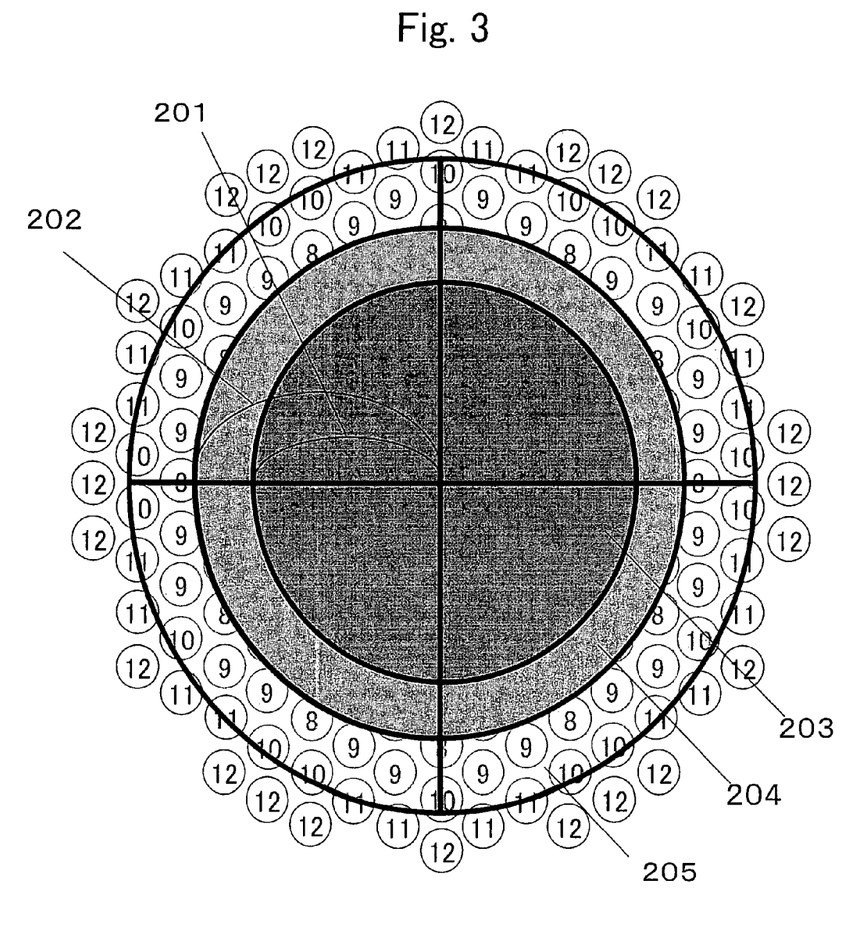
FIG. 3 is a view showing a light intensity control area of the lamp of the light irradiation heat treatment apparatus in an embodiment of the present invention.

Specifically, in a case where a semiconductor substrate is used as the workpiece 103, an independent power control area of the lamp for heating is split into three areas as shown in FIG. 3. In other words, the light irradiation intensity of the lamp is split into three areas. They are a circle area 203 existing inside an facing substrate periphery and its radius is equal to a distance 201 from a substrate center (about 80% of the substrate radius having eight-inch diameter), an area 204 existing inside the substrate periphery except the area 203, and an external area 205 of the substrate. Incidentally, a radius 202 almost equals to a perimeter of the substrate having eight-inch diameter. As described above, the workpiece 103 has a circle shape and a flat light intensity distribution from the light irradiation heating means has a concentric circle-shaped distribution.

Figure 4A:
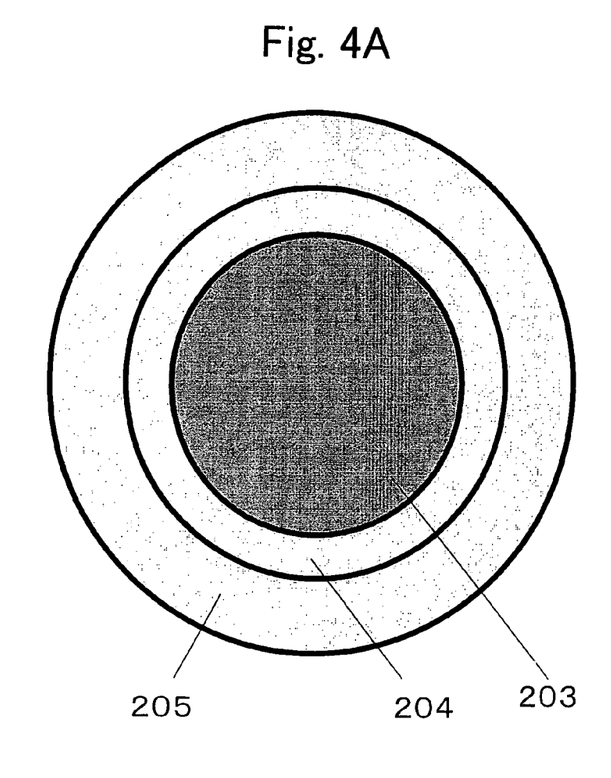
FIG. 4 is a view showing a light irradiation intensity distribution of the lamp in an embodiment of the present invention.

When actually heat-treating the substrate, if a resistivity of the substrate (silicon) is not less than 1 ohm-cm, at the open loop control process after starting the light irradiation, as shown in FIG. 4A, the same power is supplied to the lamps both in the area 204 and the area 205 so as to have the same light irradiation intensity, and a light irradiation intensity of the area 203 is made higher than that of the area 204 and the area 205. In addition, if the resistivity of the substrate (silicon) is smaller than 1 ohm-cm, at the open loop control process after starting the light irradiation, as shown in FIG. 4B, the same power is supplied to each lamp so that the light irradiation intensity may become constant in all areas of the area 203, the area 204, and the area 205.

Figure 4B:
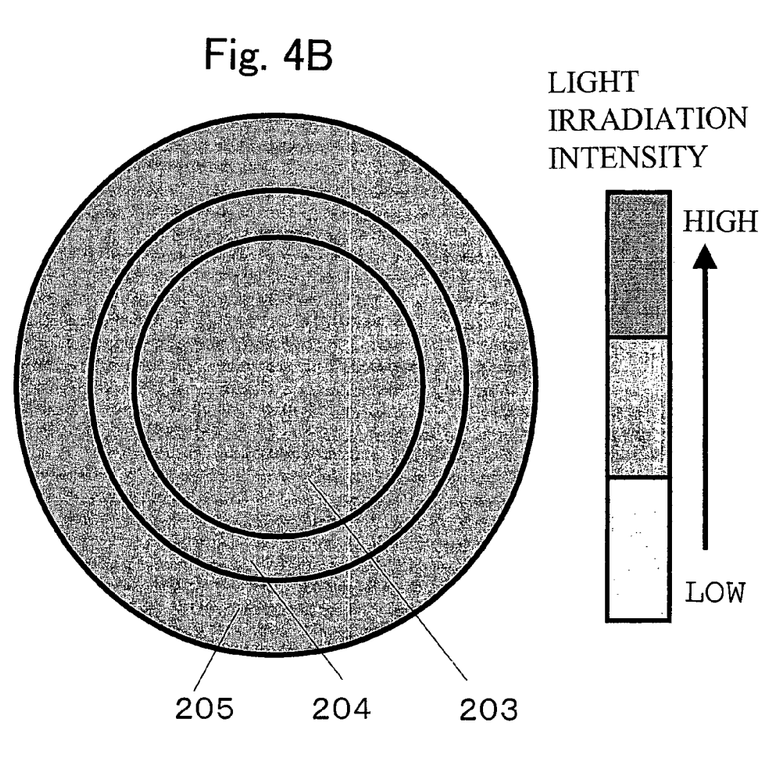
Figure 5:
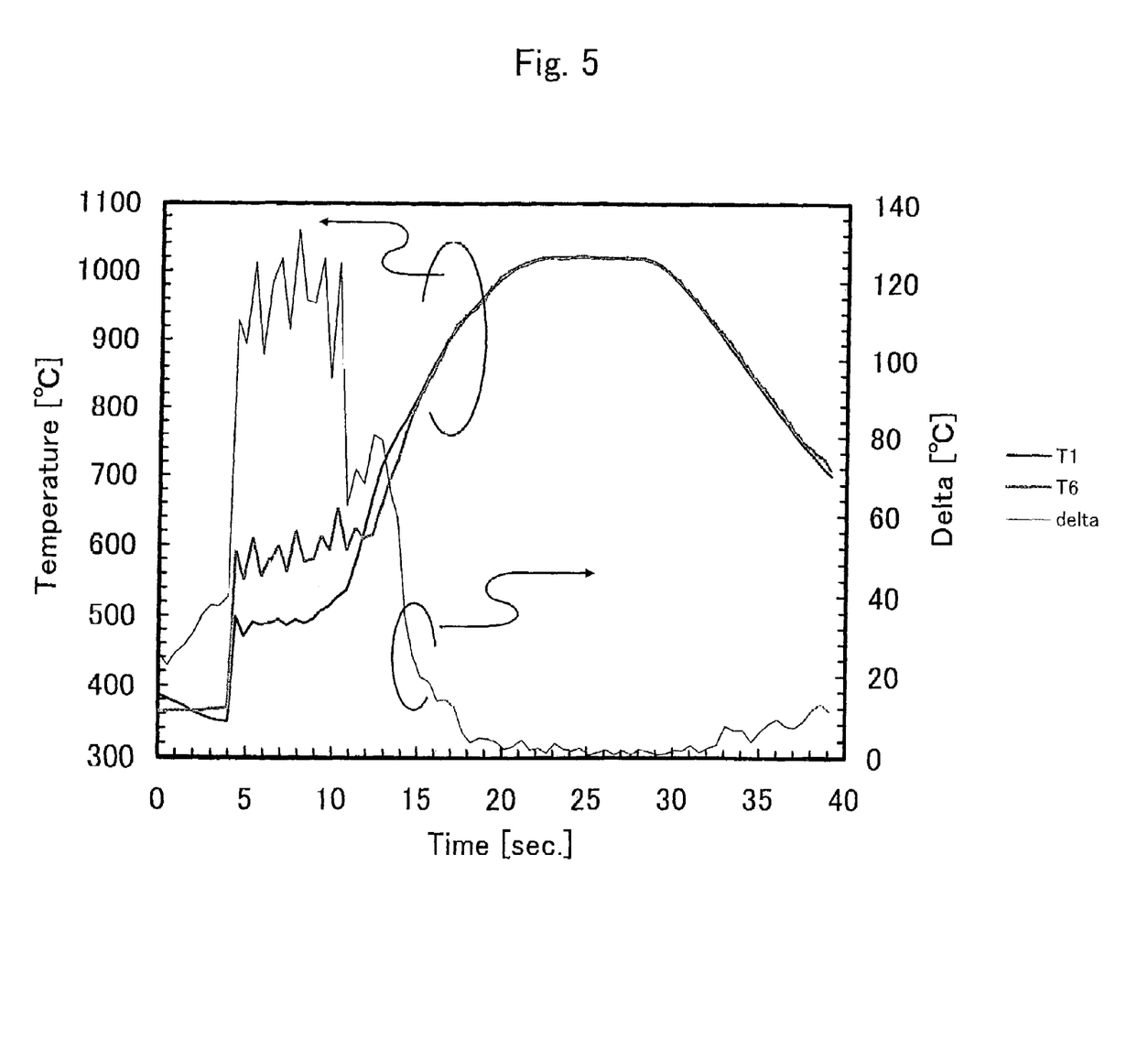
FIG. 5 is a graph showing a change of a temperature with respect to time of a workpiece according to the conventional heat treatment.
Figure 6:
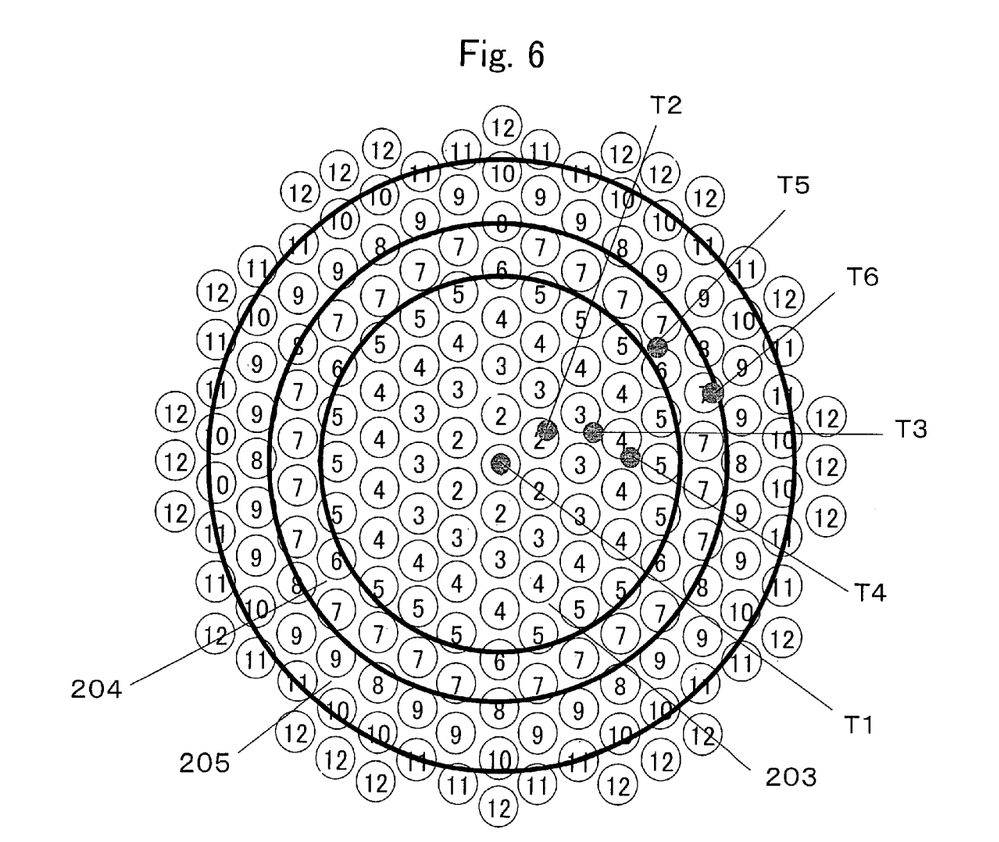
FIG. 6 is a view showing a relative location of a pyrometer for temperature measurement with respect to the lamp and the workpiece

FIG. 5 is a graph showing a change of a temperature with respect to time of the workpiece according to the heat treatment in the prior art. There is shown a change of a temperature of the substrate with respect to time obtained by supplying the same power to all of the multiple lamps 101 in FIG. 1 in a manner similar to the prior art, and making it into a uniform light intensity distribution as shown in FIG. 4B to perform the light irradiation for heating to the substrate. A horizontal axis of the graph indicates a light irradiation heat treatment time, and a first axis of vertical axes indicates a temperature of the substrate obtained through measuring a wavelength of the heated substrate radiation by the pyrometer 104 shown in FIG. 1 and converting it into a temperature; and T1 and T6 are symbols which indicate the pyrometers disposed at positions facing to a center and a periphery of the substrate, respectively. These measurement positions of T1 and T6 are shown in FIG. 6. T1 corresponds to a temperature at the center of the substrates, and T6 corresponds to a temperature at the peripheral portion. Black dots in the drawing indicate positions of the pyrometers attached to the apparatus, and T1 through T6 indicate symbols of the pyrometers. In addition, a second axis of the vertical axes is a temperature difference between a portion having the highest temperature and a portion having the lowest temperature within the substrate surface, and it is indicated as delta. Incidentally, a used material is a CZ-Si substrate (resistivity: 1–10 ohm-cm), and is typically widely used for manufacturing a semiconductor device.

In the open loop control process, when the light irradiation intensity distribution shown in FIG. 4B is used in a manner similar to the prior art, as measured temperatures during the heating from 0 to 15 seconds in FIG. 5 show, the temperature variation is large after starting the light irradiation. The reason is that the substrate is distorted by mechanical stress applied thereto caused by a rapid temperature rise, and the substrate therefore bounds on the support element 102 in FIG. 1, so that a lamp light of the upper part leaks from a gap between the substrate periphery and the support element 102, and directly enters the pyrometer 104, thereby a peripheral temperature is measured high (T6). In this case, light leakage is generated at a time of 4 seconds after starting the light irradiation.

Figure 7:
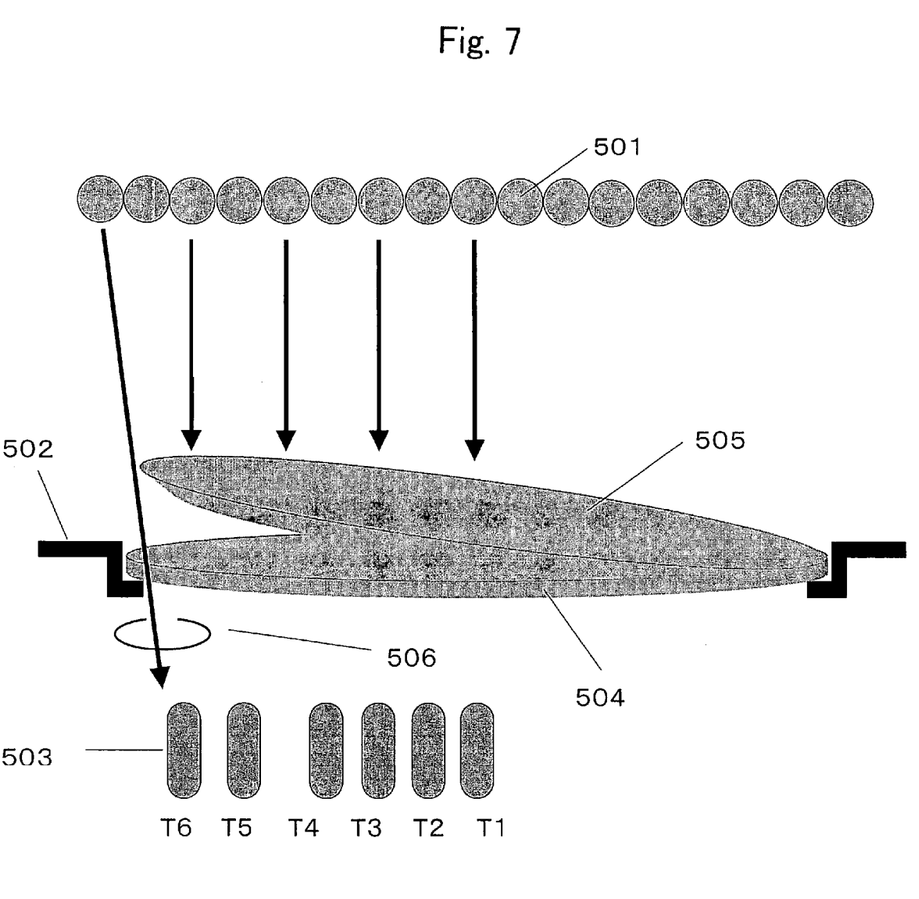
FIG. 7 is a view showing a warpage of the workpiece when performing a light irradiation using a lamp in a conventional heat treatment.

A schematic block diagram in a case where such light leakage is generated is shown in FIG. 7. Reference numeral 501 represents multiple lamps; reference numeral 502, a workpiece support element; reference numeral 503, a plurality of pyrometers; reference numeral 504, a workpiece of a normal position; reference numeral 505, a workpiece which has bounded due to distortion occurrences; and reference numeral 506, a lamp light of the upper part which has leaked from a gap between the substrate and the support element. In this way, the light 506 enters the pyrometer T6 which is located on the periphery, so that a temperature higher than that of a center is measured.

Accordingly, the temperature measured here is not a real temperature of the substrate, but the temperature incorrectly measured due to leak of the lamp light, so that in this condition, the measured temperature can not be correctly fed back to an input power control to the lamp. Since this temperature variation is caused by the distortion of the workpiece, it may also be used as an indicator for judging existence of stress.

Figure 8:
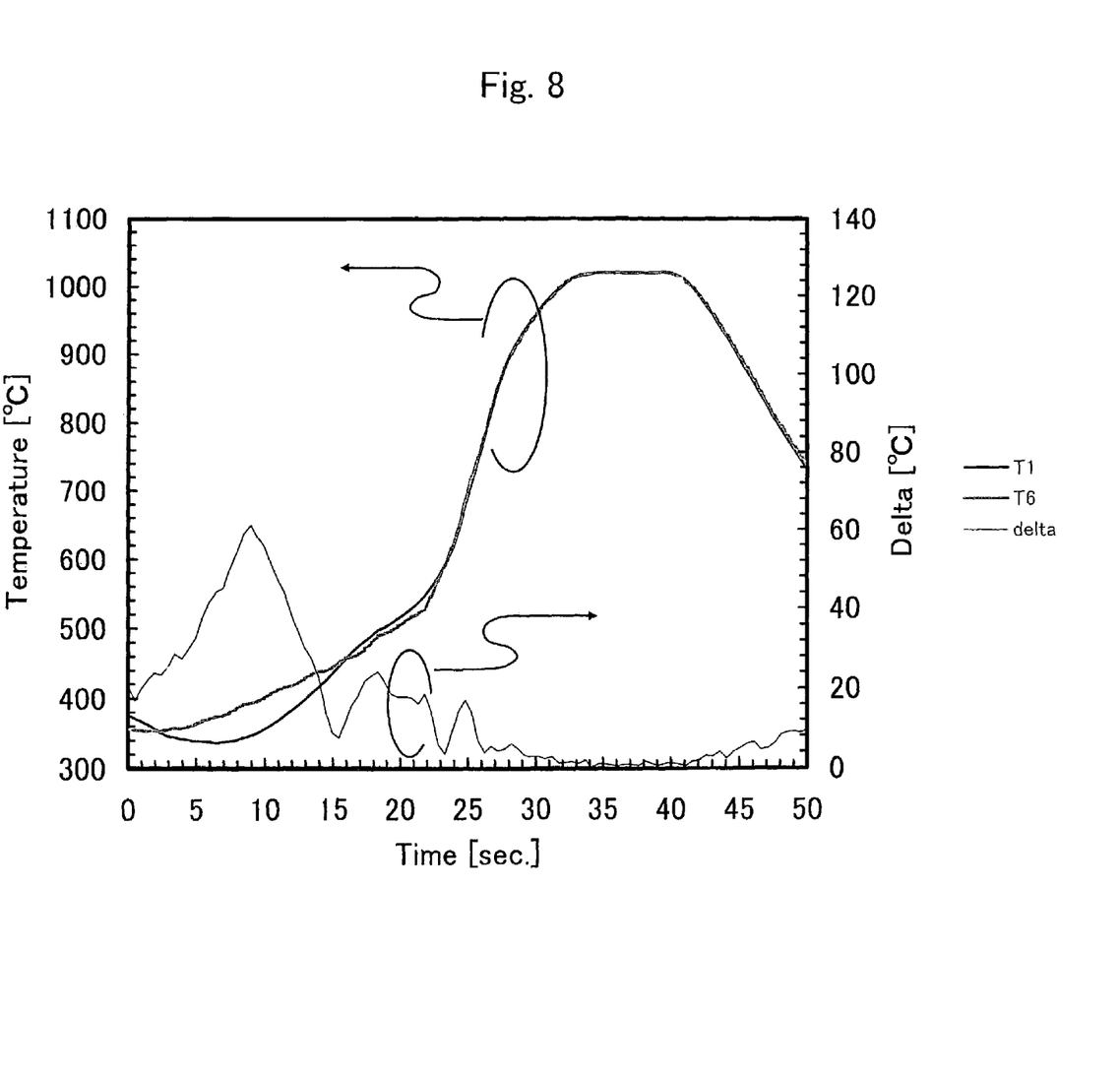
FIG. 8 is a graph showing a change of a temperature with respect to time of the workpiece by a light irradiation heat treatment method according to an embodiment of the present invention.

On the other hand, FIG. 8 is a graph showing a change of a temperature of the workpiece with respect to time according to the heat treatment of the embodiment of the present invention. There is shown a substrate temperature change when the heat treatment method of the substrate according to the embodiment of the present invention is used, in other words, at the open loop control process after starting the light irradiation, when a power control is performed to the multiple lamps 101 in the light irradiation heat treatment apparatus in FIG. 1 so as to obtain the light irradiation intensity distribution shown in FIG. 4A. A semiconductor substrate used for an experiment in FIG. 8 has a resistivity of 1 to 10 ohm-cm similar to that in FIG. 5. It is shown that if the light irradiation intensity of the center portion is made higher than that of the peripheral portion in the arrangement of the lamps, a temperature difference between the periphery (T6) and the center (T1) of the substrate can be reduced as shown in FIG. 8 (for about 0 to 20 seconds in FIG. 8), and this is considered that stress due to a rapid substrate temperature rise which has been found in the light irradiation heating in the prior art is reduced, the warpage of the substrate or the like will hardly be generated, and the lamp light for heating will not directly enter the pyrometer.

In one substrate heat treatment method according to the embodiment of the present invention, the substrate is heated and the temperature thereof is raised based on the light irradiation intensity distribution shown in FIG. 4A at the open loop control process after firstly starting the light irradiation, and after the substrate temperature has been raised not less than a certain temperature or the heating time has passed for a certain time period, the closed circuit control process is performed based on a uniform light irradiation intensity distribution shown in FIG. 4B.

Figure 9:
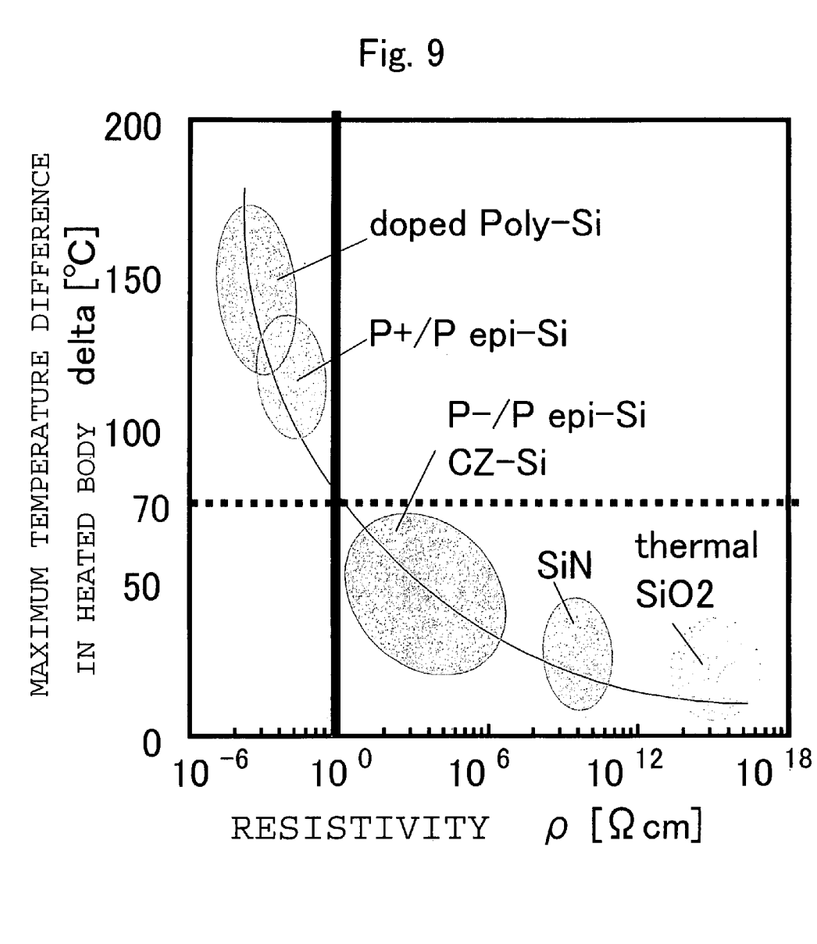
FIG. 9 is a view showing a relationship between a resistivity of the workpiece and the maximum temperature difference.

FIG. 9 is a graph showing a relationship between a resistivity of the workpiece and the maximum temperature difference in the workpiece. It shows a result obtained by applying the open loop control process of the light irradiation rapid heat treatment to substrate materials having various resistivities using the light irradiation intensity distribution shown in FIG. 4A. The maximum temperature difference of the graph indicates a difference between the temperatures measured by the pyrometers located in T1 and T6 in FIG. 6. The diameter of the substrate is eight inches, thermal $SiO_2$ is obtained by forming a thermal oxide film on the a silicon substrate, SiN is obtained by forming a SiN film on the silicon substrate, $P^-/P_{epi}$-Si is obtained by growing a P-type epitaxial layer having a medium-concentration on the silicon substrate, $P^+/P_{epi}$-Si is obtained by forming a P-type epitaxial growth layer having a medium-concentration on the high concentration silicon substrate, and doped Poly-Si is obtained by forming a polysilicon film, into which phosphorus, boron, arsenic or the like is doped, on the silicon substrate.

According to this result, when the resistivity is not less than 1 ohm-cm, it is effective for stress reduction of the workpiece to give the distribution as shown in FIG. 4A to the light irradiation intensity for heating at the open loop control process after starting the light irradiation. When the maximum temperature difference in the workpiece is not less than 70° C., the undesirable influence will significantly appear in a typical semiconductor device characteristic and reliability, so that the maximum temperature difference not more than 70° C. and a resistivity as the whole substrate not less than 1 ohm-cm become a criteria for judgment to perform the open loop control process having the light irradiation intensity distribution.

Next, when the resistivity in the substrate is less than 1 ohm-cm, the maximum temperature difference may be not less than 70° C. by performing the open loop control processs such as shown in FIG. 4A; and this is considered that since a response of the substrate to a temperature change and a temperature distribution is fast when the workpiece has a low resistance, the distribution will directly be reflected to the temperature distribution within the substrate when the distribution is given to the light irradiation intensity of the lamp. Therefore, in the embodiment of the present invention, when the resistivity in most of the substrates is not more than 1 ohm-cm, the light irradiation intensity of the lamp of the heat treatment apparatus is made uniform to then perform the open loop control process.

In the embodiment mentioned above, when the resistivity in the substrate is not less than 1 ohm-cm, the light irradiation intensity of the lamp is split into two areas of the area 203 and the area 204+area 205 as shown in FIG. 4A, but it may be configured such that the light irradiation intensity of the lamp is further split into more areas according to the resistivity of the workpiece, such as semiconductor substrate, and an input electric power and the light irradiation intensity are controlled for every area to form the intensity distribution.

Although the light irradiation heat treatment apparatus according to the embodiment of the present invention is shown in FIG. 1; and from the experimental result or the like as shown in FIG. 9 with regard to the open loop control process of the heat treatment, the apparatus may be configured such that before performing the light irradiation heat treatment, means (resistivity measurement means) of measuring the resistivity of the workpiece, and means (light irradiation intensity control means) of automatically setting the light intensity to be irradiated for every group area of the lamp so that the distribution may be generated in the light irradiation intensity of the group of the multiple lamps which are flatly provided so as to face to the workpiece based on the measured resistivity of the workpiece are added. If there is determined a relationship between the resistivity of the workpiece, and the light irradiation intensity distribution of the group of the lamps so that the maximum temperature difference in the workpiece at the open loop control process of the heat treatment may become not more than 70° C., and it is supplied to the above light intensity distribution automatic setting means, it becomes possible to achieve above apparatus.

What is claimed is:

1. A light irradiation heat treatment method for a workpiece supported in a furnace, in which a plane-shaped light irradiation heating component faces one surface of the workpiece, the method comprising:
   setting an intensity distribution for light irradiated from the light irradiation heating component in accordance with the resistivity of the workpiece; and
   irradiating light having the set light intensity distribution toward the workpiece to raise the temperature of the workpiece.

2. The method of claim 1, wherein the intensity distribution for the light is set for a flatly uniform intensity distribution when the resistivity of the workpiece is less than 1 ohm-cm.

3. The method of claim 1, wherein the intensity distribution for the light is set such that the light intensity of a peripheral portion of the distribution is less than that of a central portion when the resistivity of the workpiece is not less than 1 ohm-cm.

4. The method of claim 1, further comprising:
   raising the temperature of the workpiece by setting the light intensity of a peripheral portion of the distribution less than that of a central portion and irradiating the workpiece with the set intensity distribution;
   irradiating, after raising the temperature of the workpiece using the non-uniform intensity distribution, the workpiece with light having a flatly uniform intensity distribution; and
   heat-treating the workpiece.

5. The method of claim 4, wherein the flatly uniform light intensity distribution provided by the light irradiation heating component has the geometric form of a concentric circle-shaped distribution and this distribution is irradiated onto a circle-shaped workpiece having a resistivity that is not less than 1 ohm-cm.

6. A light irradiation heat treatment apparatus comprising:
   a support element for supporting a workpiece provided in a furnace;
   a plane-shaped light irradiation heating component that faces one surface of the workpiece;
   a temperature measuring component that faces the surface on the other side with respect to the one surface of the workpiece; and
   a light irradiation intensity control component that controls a light irradiation intensity distribution, in a plane of the light irradiation heating component, based on the resistivity of the workpiece, when raising the temperature of the workpiece.

7. A light irradiation heat treatment apparatus comprising:
   a support element for supporting a workpiece provided in a furnace;
   a plane-shaped light irradiation heating component that faces one surface of the workpiece;
   a temperature measuring component that faces the surface on the other side with respect to the one surface of the workpiece;
   a resistivity measurement component that measures the resistivity of the workpiece; and
   a light irradiation intensity control component that controls a light irradiation intensity distribution, in a plane of the light irradiation heating component, based on the measured resistivity of the workpiece, when raising the temperature of the workpiece.

8. The light irradiation heat treatment apparatus according to any one of claims 6 or 7, wherein the light irradiation heating component consists of a group of heat lamps that are flatly arranged, such that the group of the heat lamps is split into a plurality of flat areas and the light irradiation intensity for each area may be set independently of the other areas.

9. The light irradiation heat treatment apparatus according to any one of claims 6 or 7, wherein the light irradiation intensity control component controls the intensity distribution for the light such that:
   a flatly uniform intensity distribution is applied to raise the temperature of the workpiece when the resistivity of the workpiece is less than 1 ohm-cm, and
   a varying intensity distribution is applied to raise the temperature of the workpiece when the resistivity is not less than 1 ohm-cm.

10. The light irradiation heat treatment apparatus of claim 8, wherein the group of heat lamps is split into a plurality of areas that each have the shape of a flatly concentric circle and the light provided by the heat lamps is irradiated onto a semiconductor substrate workpiece.

11. The light irradiation heat treatment apparatus of claim 9, wherein the group of heat lamps is split into a plurality of areas that each have the shape of a flatly concentric circle and the light provided by the heat lamps is irradiated onto a semiconductor substrate workpiece.

12. The method of claim 1, further comprising raising the temperature of the workpiece by setting the light intensity of a peripheral portion of the distribution less than that of a central portion and irradiating the workpiece with the set intensity distribution; irradiating, after raising the temperature of the workpiece using the non-uniform intensity distribution, the workpiece with light having a flatly uniform intensity distribution; and heat-treating the workpiece, wherein the flatly uniform light intensity distribution provided by the light irradiation heating component has the geometric form of a concentric circle-shaped distribution and this distribution is irradiated onto a circleshaped workpiece having a resistivity that is not less than 1 ohm-cm.

13. The method of claim 3, further comprising raising the temperature of the workpiece by setting the light intensity of a peripheral portion of the distribution less than that of a central portion and irradiating the workpiece with the set intensity distribution; irradiating, after raising the temperature of the workpiece using the non-uniform intensity distribution, the workpiece with light having a flatly uniform intensity distribution; and heat-treating the workpiece, wherein the flatly uniform light intensity distribution provided by the light irradiation heating component has the geometric form of a concentric circle-shaped distribution and this distribution is irradiated onto a circle-shaped workpiece having a resistivity that is not less than 1 ohm-cm.

* * * * *